(12) United States Patent
Su

(10) Patent No.: US 6,317,328 B1
(45) Date of Patent: Nov. 13, 2001

(54) HEAT-RADIATING MODULE STRUCTURE

(75) Inventor: Chien-Ming Su, Taipei (TW)

(73) Assignee: Compal Electronics, Inc., Taipei (TW)

( * ) Notice: Subject to any disclaimer, the term of this patent is extended or adjusted under 35 U.S.C. 154(b) by 0 days.

(21) Appl. No.: 09/825,975

(22) Filed: Apr. 5, 2001

(51) Int. Cl.[7] ....................................... H05K 7/20
(52) U.S. Cl. ..................... 361/704; 361/717; 361/718; 361/719; 257/718; 257/719; 165/80.3; 174/16.3
(58) Field of Search .................... 361/704, 707, 361/717–719; 257/718, 719, 722, 726, 727; 174/16.3; 165/80.2, 80.3, 185

(56) References Cited

U.S. PATENT DOCUMENTS

| 5,648,893 | * | 7/1997 | Loo et al. | 361/820 |
| 5,757,621 | * | 5/1998 | Patel | 361/719 |
| 5,901,039 | * | 5/1999 | Dehaine et al. | 361/704 |
| 6,212,074 | * | 4/2001 | Gonsalves et al. | 361/717 |

\* cited by examiner

*Primary Examiner*—Leo P. Picard
*Assistant Examiner*—Boris L. Chervinsky
(74) *Attorney, Agent, or Firm*—Bacon & Thomas, PLLC

(57) ABSTRACT

Heat-radiating module structure. Locating thread holes are formed on a circuit board around a heat source mounted on the circuit board. The heat-radiating module is formed with locating sockets corresponding to the locating thread holes, in which a resilient member is inlaid. The bottom of the locating socket is formed with a restricting thread hole through which a fastening bolt is screwed. When a second screw section of the fastening bolt is screwed into the locating thread hole, the resilient member is compressed to exert a resilient pressure onto and locate the heat-radiating module on the heat source under a certain pressure. When the second screw section is unscrewed from the locating thread hole, a first screw section above the second screw section abuts against a lower side of the restricting thread hole to prevent the fastening bolt and the resilient member from bounding away from the locking socket.

16 Claims, 4 Drawing Sheets

HEAT-RADIATING MODULE STRUCTURE

BACKGROUND OF THE INVENTION

The present invention is related to an improved heat-radiating module structure, and more particularly to a heat-radiating module structure in which when detached, the fastening bolt and the resilient member are restricted from bounding away from the locking socket of the heat-radiating module. Therefore, the fastening bolt and the resilient member will not unexpectedly bound out and miss and the assembly of the heat-radiating module is facilitated.

In a conventional heat-radiating module structure, (especially that applied to CPU of a portable computer) the circuit board is formed with locating thread holes around a heat source (such as CPU) mounted on the circuit board. The heat-radiating module is formed with through holes corresponding to the locating thread holes. When assembled, bolts are directly fitted into a spring and passed through the through hole of the heat-radiating module and screwed into the locating thread hole of the circuit board. By means of the resilient force of the spring compressed between the bolt and the heat-radiating module, the heat-radiating module can exert a certain resilient pressure onto the heat source so as to locate the same without loosening.

When detaching the heat-radiating module from the heat source for maintenance or repair, in the instant of unscrewing the bolt from the locating thread hole of the circuit board, the spring and the bolt often bound away from the heat-radiating module and miss. As a result, when re-assembled, it is often necessary to find the parts and re-aim the respective parts at each other and re-fit the parts with each other. This leads to great inconvenience in maintenance and assembly.

SUMMARY OF THE INVENTION

It is therefore a primary object of the present invention to provide an improved heat-radiating module structure. The heat-radiating module is formed with locating sockets corresponding to locating thread holes of a circuit board on which a heat source is mounted. The center of the bottom of the locating socket is formed with a restricting thread hole. A first screw section formed on middle portion of a fastening bolt is screwed through the restricting thread hole. A second screw section with smaller outer diameter is formed at lower end of the fastening bolt under the first screw section. A resilient member is disposed in the locating socket of the heat-radiating module and fitted on the fastening bolt. The first screw section is screwed through the restricting thread hole and the second screw section is screwed into the locating thread hole of the circuit board. When the second screw section is unscrewed from the locating thread hole, the first screw section abuts against a lower side of the restricting thread hole and is stopped thereby so as to prevent the fastening bolt and the resilient member from bounding away. Therefore, the maintenance and assembly efficiency can be enhanced.

It is a further object of the present invention to provide the above heat-radiating module structure in which an annular groove is formed on the bottom of the locating socket of the heat-radiating module. The bottom end of the resilient member is inlaid and firmly located in the annular groove to facilitate assembly.

The present invention can be best understood through the following description and accompanying drawings wherein:

DETAILED DESCRIPTION OF THE PREFERRED EMBODIMENT

Figure 1:
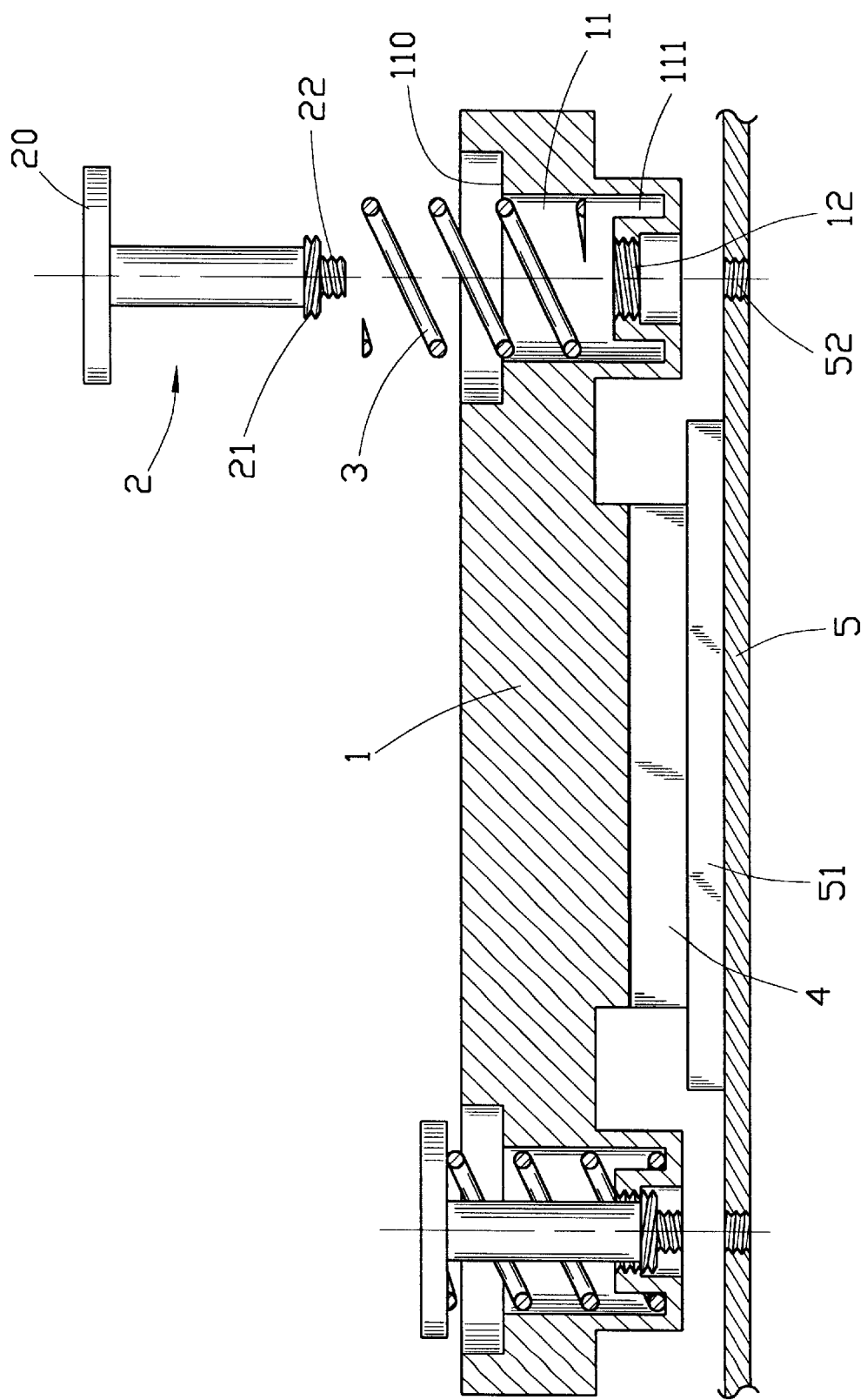
FIG. 1 is a sectional view of the present invention prior to assembly.

Please refer to FIG. 1 which is a sectional view showing the present invention prior to assembly. The present invention includes a heat-radiating module 1, fastening bolts 2 and resilient members 3. The heat-radiating module 1 is attached to a heat source 4 (such as a power transistor or CPU). The heat source 4 is inserted on an adapter 51 of a circuit board 5 (or directly inserted on the circuit board 5). The periphery of the circuit board 5 is formed with locating thread holes 52. The heat-radiating module 1 is formed with locating sockets 11 corresponding to the locating thread holes 52. The top end of the locating socket 11 is formed with an insertion step 110 having larger inner diameter. The center of the bottom of the locating socket 11 is formed with a restricting thread hole 12 having a diameter larger than that of the locating thread hole 52. The directions of threads of the two thread holes are reverse to each other. In addition, the periphery of the restricting thread hole 12 is formed with an annular groove 111. The resilient member 3 (such as a coil spring) is disposed in the locating socket 11 of the heat-radiating module 1. The bottom end of the resilient member 3 is fixedly inlaid in the annular groove 111. The fastening bolt 2 is passed through the resilient member 3. The fastening bolt 2 is a multistage body with different diameters. One end of the fastening bolt 2 is formed with a restricting cap 20 having such a diameter that the restricting cap 20 is snugly retained on the insertion step 110. Near the other end of the fastening bolt 2 is formed a first screw section 21 having slightly larger outer diameter. The first screw section 21 is passed through the resilient member 3 and downward screwed through the restricting thread hole 12 of the heat-radiating module 1. The first screw section 21 always abuts against a lower side of the restricting thread hole 12 (as shown in left side of FIG. 1). The end of the fastening bolt 2 has a coaxially extending second screw section 22 under the first screw section 21. The second screw section 22 has a smaller diameter and can be screwed into the locating thread hole 52 of the circuit board 5.

When the two screw sections 21, 22 of the fastening bolt 2 are passed through the resilient member 3 and screwed through the restricting thread hole 12 of the heat-radiating module 1, the restricting cap 20 presses the top end of the resilient member 3. Accordingly, the resilient member 3 resiliently upward pushes the fastening bolt 2 away from the annular groove 111.

Figure 2:
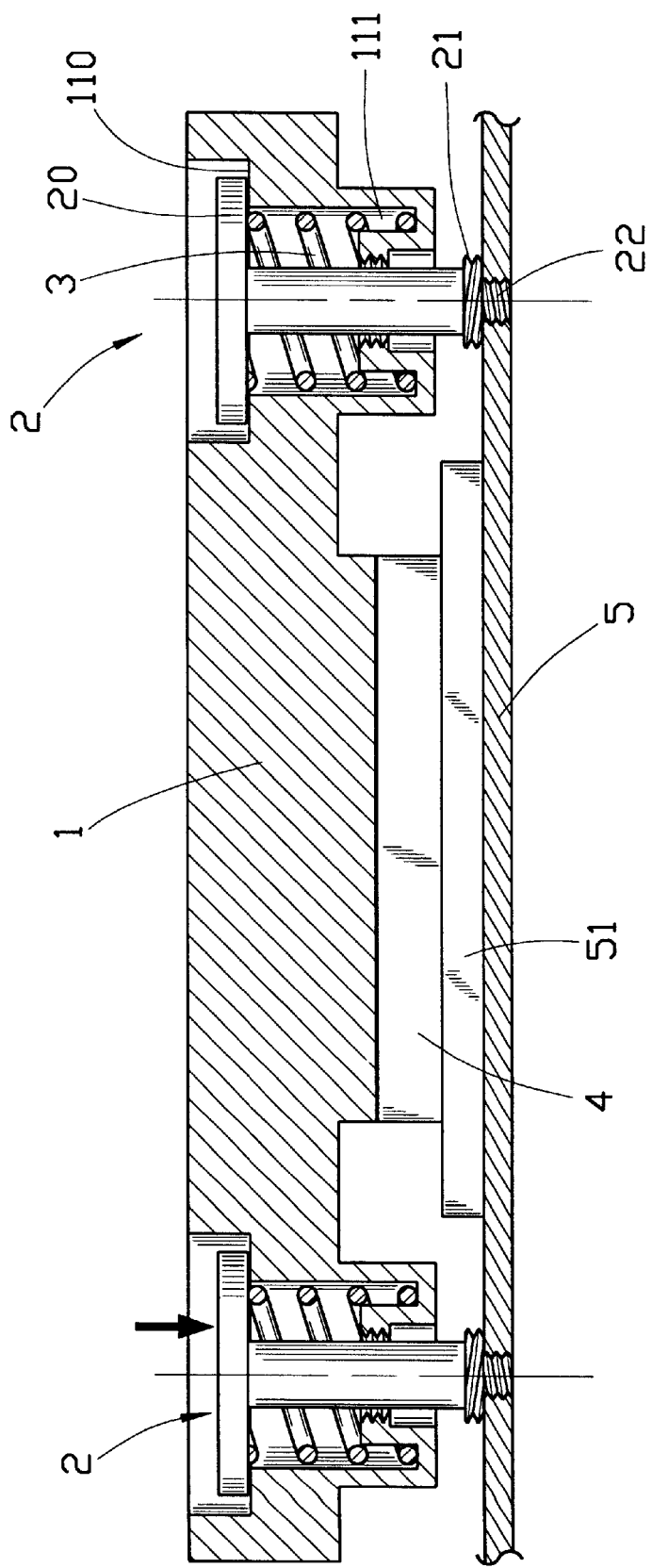
FIG. 2 is a sectional view of the present invention in an assembled state.

Referring to FIG. 2, when assembled, the fastening bolt 2 is first pressed downward, making the second screw section 22 screwed into the locating thread hole 52 of the circuit board 5. At this time, the restricting cap 20 of the fastening bolt 2 presses the top end of the resilient member 3 and retained on the insertion step 110. The resilient member 3 is compressed between the restricting cap 20 and the annular groove 111 to exert a certain resilient pressure onto the heat-radiating module 1. Therefore, the heat-radiating module 1 is located on the heat source 4 and evenly contacts therewith under a certain pressure for achieving a good heat-radiating effect.

Figure 3:
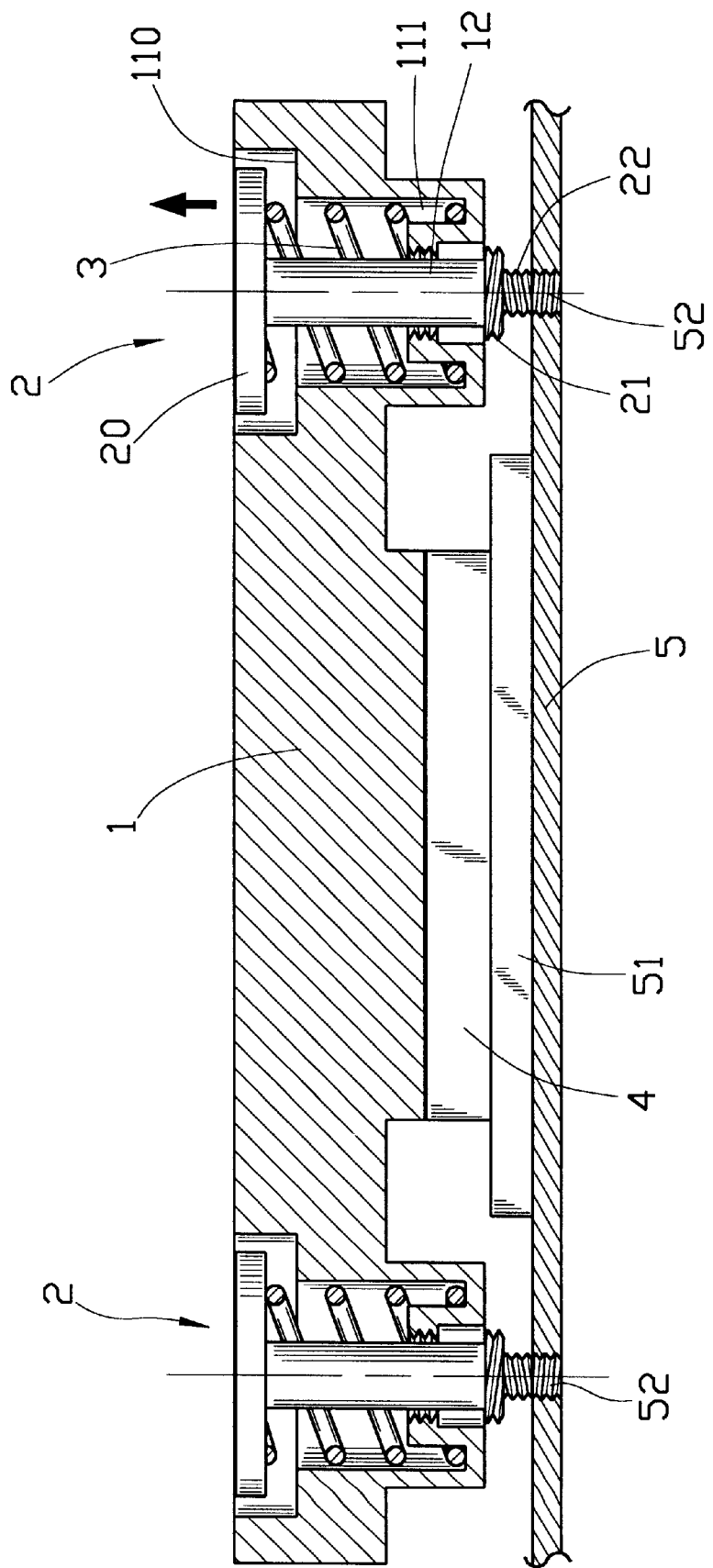
FIG. 3 is a sectional view of the present invention, showing that the fastening bolt is unscrewed from the locating thread hole.
Figure 4:
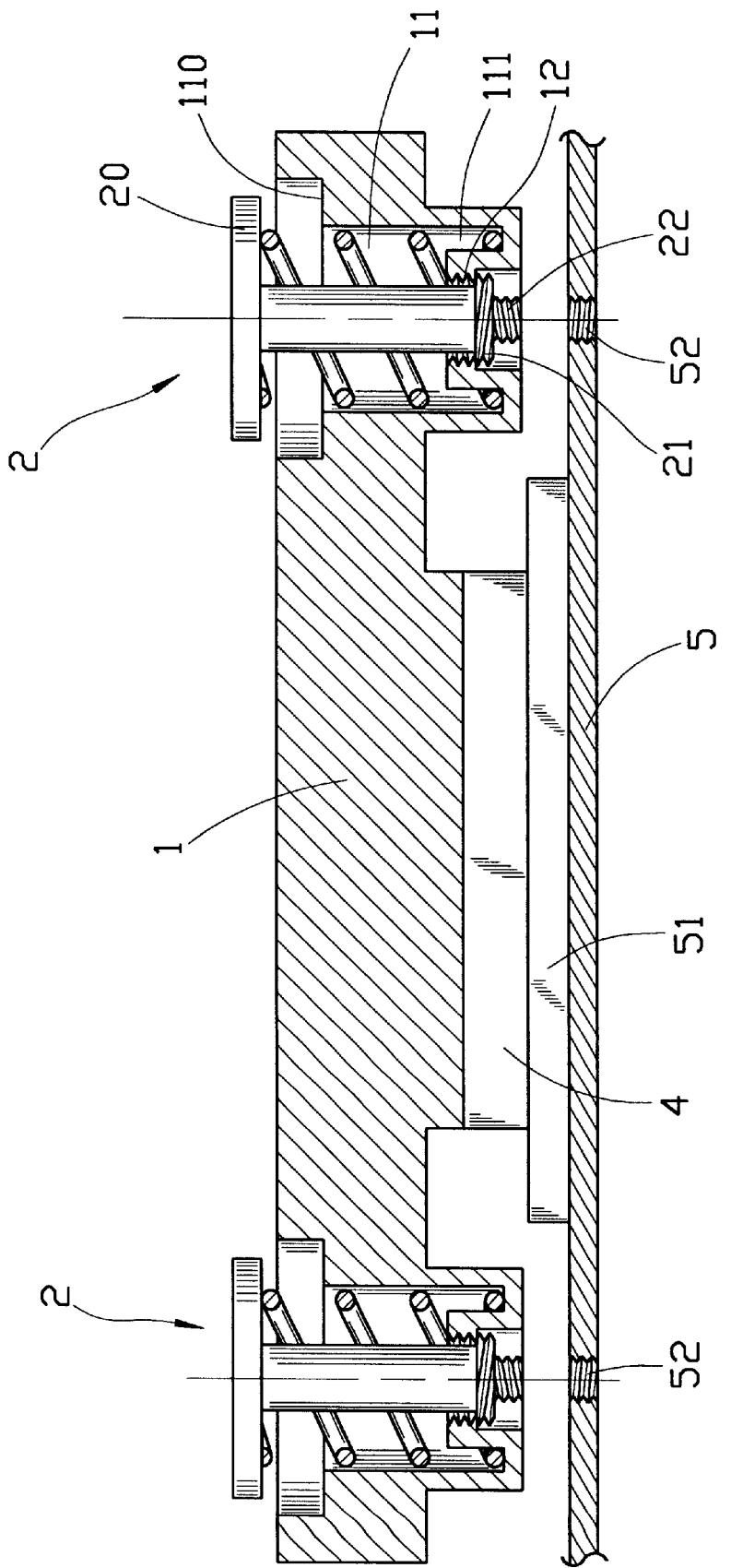
FIG. 4 is a sectional view of the present invention, showing that the fastening bolt is unscrewed from the locating thread hole and stopped from bounding away from the locating socket of the heat-radiating module.

Please refer to FIG. 3. When disassembled, the fastening bolt 2 is untightened to make the second screw section 22 unscrewed from the locating thread hole 52 of the circuit board 5. The first screw section 21 has a diameter different from that of the second screw section 22. When unscrewing the second screw section 22, the first screw section 21 will not be screwed into the restricting thread hole 12 and is stopped thereunder. Accordingly, the fastening bolt 2 is prevented from totally bounding out of the locating socket 11. (In order to ensure this, the threads of the first screw section 21 and the second screw section 22 have reverse directions. As shown in FIG. 4, the first screw section 21 keeps abutting against lower side of the restricting thread hole 12 so that when detaching the heat-radiating module 1 from the heat source 4, the fastening bolt 2 and the resilient member 3 are still associated with the heat-radiating module 1. Unless manually disassembled, the resilient member 3 itself cannot resiliently bound away. Therefore, the fastening bolt 2 can be easily again tightened. Accordingly, the fastening bolt and spring will not bound out and miss and it is no more necessary to re-aim the respective components at each other and re-fit the components with each other.

The above embodiment is only used to illustrate the present invention, not intended to limit the scope thereof. Many modifications of the above embodiment can be made without departing from the spirit of the present invention.

What is claimed is:

1. Heat-radiating module structure comprising:
   a heat-radiating module formed with locating sockets corresponding to locating thread holes of a circuit board on which a heat source is mounted, a center of the bottom of the locating socket being formed with a restricting thread hole;
   a resilient member disposed in the locating socket of the heat-radiating module, a bottom end of the resilient member being fitted around the restricting thread hole; and
   a fastening bolt, one end of the fastening bolt being formed with a restricting cap, the other end of the fastening bolt being formed a first screw section having slightly larger outer diameter and a second screw section under the first screw section, the first screw section being able to be screwed into/unscrewed out of the restricting thread hole, the second screw section being able to be screwed into the locating thread hole of the circuit board, the fastening bolt being fitted into the resilient member and screwed through the restricting thread hole of the heat-radiating module, whereby by means of the outer thread of the first screw section and the inner thread of the restricting thread hole, when the second screw section is unscrewed from the locating thread hole, the first screw section abuts against a lower side of the restricting thread hole and is stopped thereby so as to prevent the fastening bolt and the resilient member from bounding away.

2. Heat-radiating module structure as claimed in claim 1, wherein a periphery of the restricting thread hole is formed with an annular groove on the bottom of the locating socket of the heat-radiating module, the bottom end of the resilient member being inlaid and located in the annular groove.

3. Heat-radiating module structure as claimed in claim 1, wherein the resilient member is a coil spring.

4. Heat-radiating module structure as claimed in claim 1, wherein the locating thread holes of the circuit board are positioned along a periphery of the heat source.

5. Heat-radiating module structure as claimed in claim 1, wherein the directions of the threads of the first screw section and the second screw section are reverse to each other.

6. Heat-radiating module structure as claimed in claim 2, wherein the directions of the threads of the first screw section and the second screw section are reverse to each other.

7. Heat-radiating module structure as claimed in claim 3, wherein the directions of the threads of the first screw section and the second screw section are reverse to each other.

8. Heat-radiating module structure as claimed in claim 4, wherein the directions of the threads of the first screw section and the second screw section are reverse to each other.

9. Heat-radiating module structure as claimed in claim 1, wherein top end of the locating socket is formed with an insertion step having larger inner diameter, the restricting cap of the fastening bolt being snugly retained on the insertion step, whereby when locking the fastening bolt on the circuit board, the restricting cap of the fastening bolt compresses the resilient member toward the annular groove of the locating socket so as to exert a resilient pressure onto the heat-radiating module, whereby the heat-radiating module is located on the heat source and evenly contacts therewith under a certain pressure.

10. Heat-radiating module structure as claimed in claim 2, wherein top end of the locating socket is formed with an insertion step having larger inner diameter, the restricting cap of the fastening bolt being snugly retained on the insertion step, whereby when locking the fastening bolt on the circuit board, the restricting cap of the fastening bolt compresses the resilient member toward the annular groove of the locating socket so as to exert a resilient pressure onto the heat-radiating module, whereby the heat-radiating module is located on the heat source and evenly contacts therewith under a certain pressure.

11. Heat-radiating module structure as claimed in claim 3, wherein top end of the locating socket is formed with an insertion step having larger inner diameter, the restricting cap of the fastening bolt being snugly retained on the insertion step, whereby when locking the fastening bolt on the circuit board, the restricting cap of the fastening bolt compresses the resilient member toward the annular groove of the locating socket so as to exert a resilient pressure onto the heat-radiating module, whereby the heat-radiating module is located on the heat source and evenly contacts therewith under a certain pressure.

12. Heat-radiating module structure as claimed in claim 4, wherein top end of the locating socket is formed with an insertion step having larger inner diameter, the restricting cap of the fastening bolt being snugly retained on the insertion step, whereby when locking the fastening bolt on the circuit board, the restricting cap of the fastening bolt compresses the resilient member toward the annular groove of the locating socket so as to exert a resilient pressure onto the heat-radiating module, whereby the heat-radiating module is located on the heat source and evenly contacts therewith under a certain pressure.

13. Heat-radiating module structure as claimed in claim 5, wherein top end of the locating socket is formed with an insertion step having larger inner diameter, the restricting cap of the fastening bolt being snugly retained on the insertion step, whereby when locking the fastening bolt on the circuit board, the restricting cap of the fastening bolt compresses the resilient member toward the annular groove of the locating socket so as to exert a resilient pressure onto the heat-radiating module, whereby the heat-radiating module is located on the heat source and evenly contacts therewith under a certain pressure.

14. Heat-radiating module structure as claimed in claim 6, wherein top end of the locating socket is formed with an insertion step having larger inner diameter, the restricting cap of the fastening bolt being snugly retained on the insertion step, whereby when locking the fastening bolt on the circuit board, the restricting cap of the fastening bolt compresses the resilient member toward the annular groove of the locating socket so as to exert a resilient pressure onto the heat-radiating module, whereby the heat-radiating module is located on the heat source and evenly contacts therewith under a certain pressure.

15. Heat-radiating module structure as claimed in claim 7, wherein top end of the locating socket is formed with an insertion step having larger inner diameter, the restricting cap of the fastening bolt being snugly retained on the insertion step, whereby when locking the fastening bolt on the circuit board, the restricting cap of the fastening bolt compresses the resilient member toward the annular groove of the locating socket so as to exert a resilient pressure onto the heat-radiating module, whereby the heat-radiating module is located on the heat source and evenly contacts therewith under a certain pressure.

16. Heat-radiating module structure as claimed in claim 8, wherein top end of the locating socket is formed with an insertion step having larger inner diameter, the restricting cap of the fastening bolt being snugly retained on the insertion step, whereby when locking the fastening bolt on the circuit board, the restricting cap of the fastening bolt compresses the resilient member toward the annular groove of the locating socket so as to exert a resilient pressure onto the heat-radiating module, whereby the heat-radiating module is located on the heat source and evenly contacts therewith under a certain pressure.

\* \* \* \* \*